United States Patent
Fong et al.

[11] Patent Number: 5,902,404
[45] Date of Patent: *May 11, 1999

[54] RESONANT CHAMBER APPLICATOR FOR REMOTE PLASMA SOURCE

[75] Inventors: Gary Fong, Cupertino; Irwin Silvestre, Santa Clara; Quoc Truong, San Jose, all of Calif.

[73] Assignee: Applied Materials, Inc., Santa Clara, Calif.

[ * ] Notice: This patent is subject to a terminal disclaimer.

[21] Appl. No.: 08/811,401

[22] Filed: Mar. 4, 1997

[51] Int. Cl.⁶ .................................................. C23C 16/00
[52] U.S. Cl. .................. 118/723 ME; 118/723 MW; 156/345; 313/231.31
[58] Field of Search ............ 156/345; 118/723 R, 118/723 MW, 723 ME, 723 MR, 723 MA; 204/298.38, 298.09; 313/231.31

[56] References Cited

U.S. PATENT DOCUMENTS

| | | | |
|---|---|---|---|
| 4,699,689 | 10/1987 | Bersin | 156/643 |
| 4,988,644 | 1/1991 | Jucha et al. | 437/225 |
| 5,262,610 | 11/1993 | Huang et al. | |
| 5,453,125 | 9/1995 | Krogh | 118/723 MR |
| 5,747,917 | 5/1998 | Hercher | 313/231.31 |

*Primary Examiner*—R. Bruce Breneman
*Assistant Examiner*—Luz Alejandro
*Attorney, Agent, or Firm*—Patterson & Associates

[57] ABSTRACT

A remote source of partially ionized plasma gas having ions and excited neutral atom species therein is provided. A chamber having a metallic outer shell and an inner insulative tube, is operated as a microwave resonant cavity, preferably having a diameter of about one quarter of the operating wavelength. A waveguide couples microwave energy from a source to a slot cut into the metallic outer shell of the cavity. Microwave energy passes through the inner energy transparent tube and excites reactant gases supplied from an input tube. Plasma is conducted from the cavity by a plasma output tube coupled into a processing chamber and controlled pressure pumping system.

17 Claims, 3 Drawing Sheets

RESONANT CHAMBER APPLICATOR FOR REMOTE PLASMA SOURCE

BACKGROUND OF THE INVENTION

1. Field of the Invention

The present invention relates generally to a remote plasma source for exciting a process gas into a plasma state. More particularly, the present invention relates to a remote plasma source for delivering excited gas species into a processing chamber in which a substrate is to be processed.

2. Background of the Related Art

Plasma assisted chemical reactions have been widely used in the semiconductor and flat panel display industries. One example is plasma-enhanced chemical vapor deposition (PECVD), which is a process that is used in the manufacture of integrated circuits and thin film transistors (TFT) for active-matrix liquid crystal displays (AMLCDs). hi accordance with capacitively coupled PECVD, a substrate is placed in a vacuum deposition chamber that is equipped with a pair of parallel plate electrodes. One of the electrodes, e.g., the lower electrode, generally referred to as a susceptor, holds the substrate. The other electrode, i.e., the upper electrode, functions as a gas inlet manifold or shower head to deliver gases into the chamber. During deposition, a reactant gas is supplied into the chamber through the upper electrode and a radio frequency (RF) voltage is applied between the electrodes to produce a plasma within the reactant gas. The plasma provides energy and enhances chemical reactions.

Although such systems are designed to preferentially deposit the material onto the surface of a substrate, they also deposit material onto other interior surfaces within the chamber. Consequently, after repeated use, the deposited layer of material that has built up in the chamber must be removed, typically using an in-situ dry cleaning process. According to the in-situ technique, precursor gases are supplied to the chamber. Then, by locally applying a glow discharge plasma to the precursor gases within the chamber, reactive species are generated. The reactive species clean the chamber surfaces by reacting with the deposits to form volatile compounds that can be removed in their gaseous state.

However, this in-situ cleaning technique has several disadvantages. First, it is inefficient to use a plasma within the chamber to generate the reactive species. Thus, it is necessary to use relatively high powers to achieve an acceptable cleaning rate. The high power levels, however, tend to produce damage to the hardware inside of the chamber, thereby significantly shortening its useful life. Since the replacement of the damaged hardware can be quite costly, this can significantly increase the per substrate cost of product that is processed using the deposition system. In the highly competitive semiconductor fabrication industry where substrate costs are critical, the increased operating costs resulting from periodic replacement of parts that are damaged during the cleaning process is undesirable.

Another problem with the conventional in-situ dry cleaning processes is that the high power levels that are required to achieve acceptable cleaning rates also tend to generate residues or byproducts that can damage other system components or which cannot be removed except by physically wiping off the internal surfaces of the chamber. For example, in a $Si_3N_4$ deposition system which uses $NF_3$ for cleaning, $N_xH_yF_z$ compounds tend to be generated. These ammonium compounds deposit in the vacuum pump where they can negatively affect the reliability of the pump used to create and maintain the vacuum environment in which the substrates are processed.

Deposition chambers or process kit components (e.g., a heater, shower head, clamp ring, etc.) made of ceramic or aluminum are often cleaned using an $NF_3$ plasma, which contains excited $F^*_{(Gas)}$ species. During this cleaning process, a certain amount of $Al_xF_y$ is formed on the exposed surfaces of the chamber and the process kit components. The amount of $Al_xF_y$ that is formed is greatly increased by the level of ion bombardment that results from the high plasma energy levels. Thus, a considerable amount of $Al_xF_y$ can be formed in the system. Unfortunately, this material cannot be etched away by any known chemical process, so the chamber must be shut down and opened so that the deposits can be physically removed by wiping the interior surfaces of the chamber.

U.S. Pat. No. 4,988,644 discloses a remote plasma generator having a cooling jacket. However, the cooling jacket is limited to the gas tubes on the gas input tube 266 and quartz outlet tube 256 of the resonant cavity 260. The gas passage 270 which runs through the resonant cavity 260 and the resonant cavity 260 itself are not cooled. Consequently, the temperature of the quartz tube within the resonant cavity is still not controlled.

U.S. Pat. No. 5,262,610 discloses another remote plasma generator having a cooling system which utilizes a double wall quartz inlet tube 20 and a water cooled jacket 56 which couples the microwave applicator 54 to a matching device 52. However, the cooling jacket 56 does not extend around the portion of the gas tube 32 that is disposed within the microwave applicator 54. Therefore, the hottest region of the gas tube, which is the most likely region to crack and/or generate particles, extends into the microwave applicator where there is no cooling.

Therefore, there is a need for a remote plasma generator with a microwave resonant cavity and gas tube that can be cooled. It would be desirable if the cooling could be provided adjacent to the gas tube along the entire length of the resonant cavity. It would be further desirable if the generator provided tuning and matching adjustments to obtain efficient operation over a wide range of pressures and reactant gases.

SUMMARY OF THE INVENTION

The present invention provides a remote plasma source comprising a resonant cavity or chamber having conductive metallic walls, a gas inlet, a gas outlet and a window. The remote plasma source also includes a source of microwave energy disposed to communicate microwave energy through a window into the chamber to excite gases passing through the chamber. A chamber comprising a cooling jacket is disposed in thermal communication with an applicator tube. The conductive metallic walls define a shell or cover that contains the microwaves and is electrically grounded. It is preferred that the chamber have a generally cylindrical profile with a diameter of about one quarter wavelength at the operating microwave frequency, which is typically about 2.45 GHz. The source of microwave energy communicates with the chamber window through a waveguide having a tuning member for matching the impedance of the waveguide to the impedance of the resonant cavity.

The applicator tube is in fluid communication between the gas inlet and the gas outlet. The gas containing member is substantially transparent to microwave energy, such as an insulative material selected from the group consisting of sapphire, quartz, aluminum oxides, or polytetrafluoroethylene. A compressible and microwave transparent material may be disposed between the applicator tube and the chamber walls. The cooling jacket is generally comprised of a plurality of channels formed in the chamber walls for the passage of a heat transfer fluid.

The invention also provides a remote plasma source, comprising a chamber having a cylindrical metal wall, cooling channels formed within the metal wall, a window extending through the wall, a gas inlet and a gas outlet; a microwave transparent gas tube extending through the chamber in fluid communication with the gas inlet and gas outlet; and a source of microwave energy communicating microwave energy through the window into the chamber. The remote plasma source may further include a compressible and substantially microwave transparent material disposed between the gas tube and the chamber walls.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
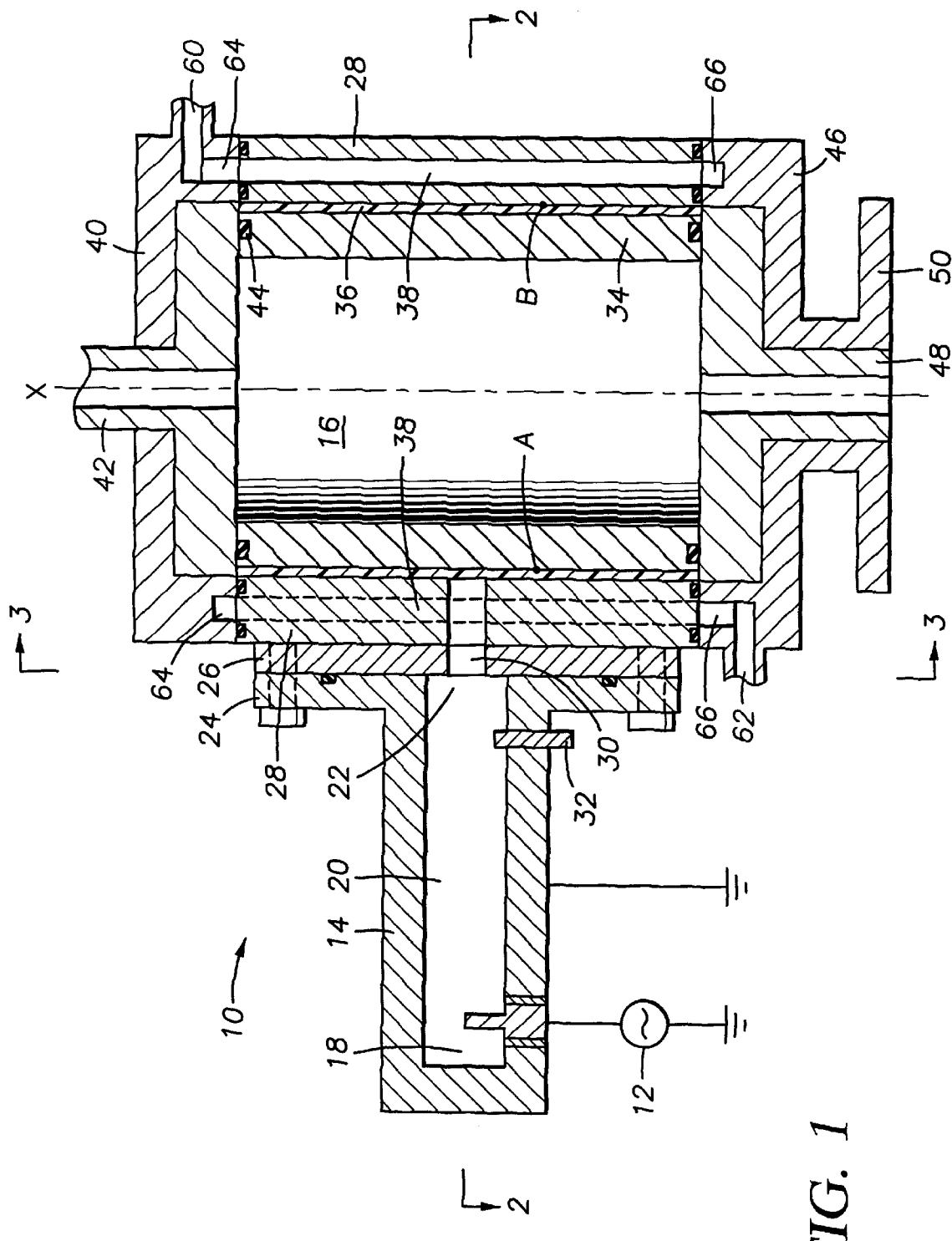
FIG. 1 is a cross-sectional side view of a remote plasma generator 10 of the present invention having a microwave power source and waveguide coupled to a resonant cavity.

FIG. 1 is a cross-sectional side view of a remote plasma source 10 having a microwave power source 12 and waveguide 14 coupled to a resonant cavity 16. The microwave power source or generator 12 is typically operated at the assigned industrial microwave frequency of 2.45 GHz having a wavelength of about 12 cm. The conventional microwave power source 12 is electrically coupled to a stub antenna 18 which extends into the waveguide 14. The waveguide 14 is preferably sized to operate in the $TE1_0$ mode (transverse electric field).

The waveguide 14 forms an elongate chamber 20 with an open end 22 equipped with a flanged connection 24 for coupling to the resonant cavity 16 via a flange 26 on the metallic outer cover or shell 28. The open end 22 is centered on a transverse slot 30 which extends through the flange 26 and sidewall 28. At the juncture of the waveguide 14 and the metallic outer wall 22 of the resonant cavity 16, the slot 30 and a capacitive tuning stub 32 (whose length may be varied) form an impedance matching network to couple the microwave energy from the waveguide chamber 20 into the cavity 16. The metallic skin of the waveguide 14 and one side of the microwave generator 12 are preferably grounded.

The resonant cavity 16 comprises an outer cover 28 formed of a metal, such as aluminum, brass or stainless steel, and is electrically grounded. An inner liner 34 is disposed inside the cavity 16 to form a gas containing passage therethrough. The liner 34 is made of a microwave transparent, dielectric material, such as sapphire, quartz, ceramic, borosilicate glass or the like. It is preferred that the resonant cavity 16 also include a compressible material layer 36 disposed between the outer cover 28 and the liner 34 to secure the two members 28,34 while allowing for differences in expansion under a wide range of temperatures. The layer 36 may made from any known compressible material, such as rubber or a polymeric material, so long as the material is substantially microwave transparent and is stable at high temperatures.

The outer cover 28 of the present invention, which defines the chamber, includes a plurality of channels 38 formed therein for the passage of a heat transfer fluid. While the channels 38 may be given any configuration or pattern within the cover 28, it is preferred to have a cylindrical cover 28 with channels 38 that run parallel to the axis x of the cylindrical cover 28. However, any pattern of channels may be used to achieve the advantages of the present invention. Because the window or slot 30 extends through the cover 28, it is necessary to provide a gap between the cooling channels 38a, 38b (See FIG. 2) positioned on either side of the slot 30. In this configuration, the cooling channels 38 provide cooling around the entire perimeter of the cavity 16 and, in particular, adjacent the entire liner 34, which is subject to cracking or etching at a high temperature.

The chamber, as defined by metal cover 28, has a preferred inner diameter of one-fourth of the microwave wavelength ($\lambda/4$) in which a standing wave electric field (E) is developed. The metal cover 28 may be grounded to protect the integrity of the chamber and the chamber circuitry from any static discharge or induced electrical currents that may build in or on the chamber. The strong E field developed in the resonant cavity 16 is used to break down gases into a partially ionized plasma having active species or excited neutral atoms therein. The gases are supplied to the resonant cavity through a flanged metal lid 40 having a gas inlet port 42 formed therein. The gas inlet port 42 is preferably comprised of a microwave transparent, insulative material since it is exposed to the plasma and active species therein. The gas inlet port 42 and liner 34 are held together in a gas tight relationship during use, preferably using an O-ring 44 therebetween.

The lids 40, 46 are also provided with a cooling fluid inlet and outlet port 60, 62. One of the ports, such as port 60, is coupled to a supply of heat transfer fluid and the other port, such as port 62, is coupled to a recovery/recycle reservoir or some external heat exchange system (not shown). Accordingly, the heat transfer fluid is supplied through the inlet port 60, distributed around the distribution manifold 64, passed through each of the cooling channels 38 (shown here in a parallel flow arrangement), collected in the manifold 66 and withdrawn through outlet port 62. This arrangement provides substantially even cooling around the perimeter of the cavity 16.

It is also important to note that the heat transfer fluid, such as water or other commercially available specialty fluid, is passed entirely through metal components. Since metals are not microwave transparent, the microwaves are reflected off the inner surface of the cover 28 so that the heat transfer fluid is not subjected to the microwaves. In addition, cooling coils are not disposed in the resonant cavity, thereby increasing the coupling of energy into the gases.

The plasma and excited atoms are withdrawn through the flanged metal lid 46 having a gas output port 48 formed therein. The metal lid 46 is not only flanged to the resonant cavity 16, but also includes a flange 50 for coupling the entire remote plasma generator 10 to a processing chamber (not shown) in which it is desired to use the generated plasma. A pumping system is used to maintain the desired gas pressure in the resonant cavity 16 and to withdraw ions and active species through the output port 48. As one example, a dry pump connected to the process chamber may be used. The chamber pumping system, along with the gas flow control into the applicator, may be used to maintain the desired pressure in both the applicator and the chamber. Preferably, a pressure of from about 2 to about 10 Torr is established in the applicator tube to excite the gases provided therein. While this pressure is preferred, it is to be understood that spiking occurs when plasma is struck and other pressure ranges may be utilized depending on temperature and materials used.

The arrangement of the cover 28, lid 40 and lid 46 combine to provide a single, generally cylindrical outer shell of metallic skin that serves as a microwave resonant cavity. The lids 40, 46 may be secured to the cover 28 using any conventional type of fastener, including clamps, bolts, screws, and the like. And although the generator 10 is referred to as being remote, it is preferred that the generator be placed as close to the processing chamber as practical.

Figure 2:
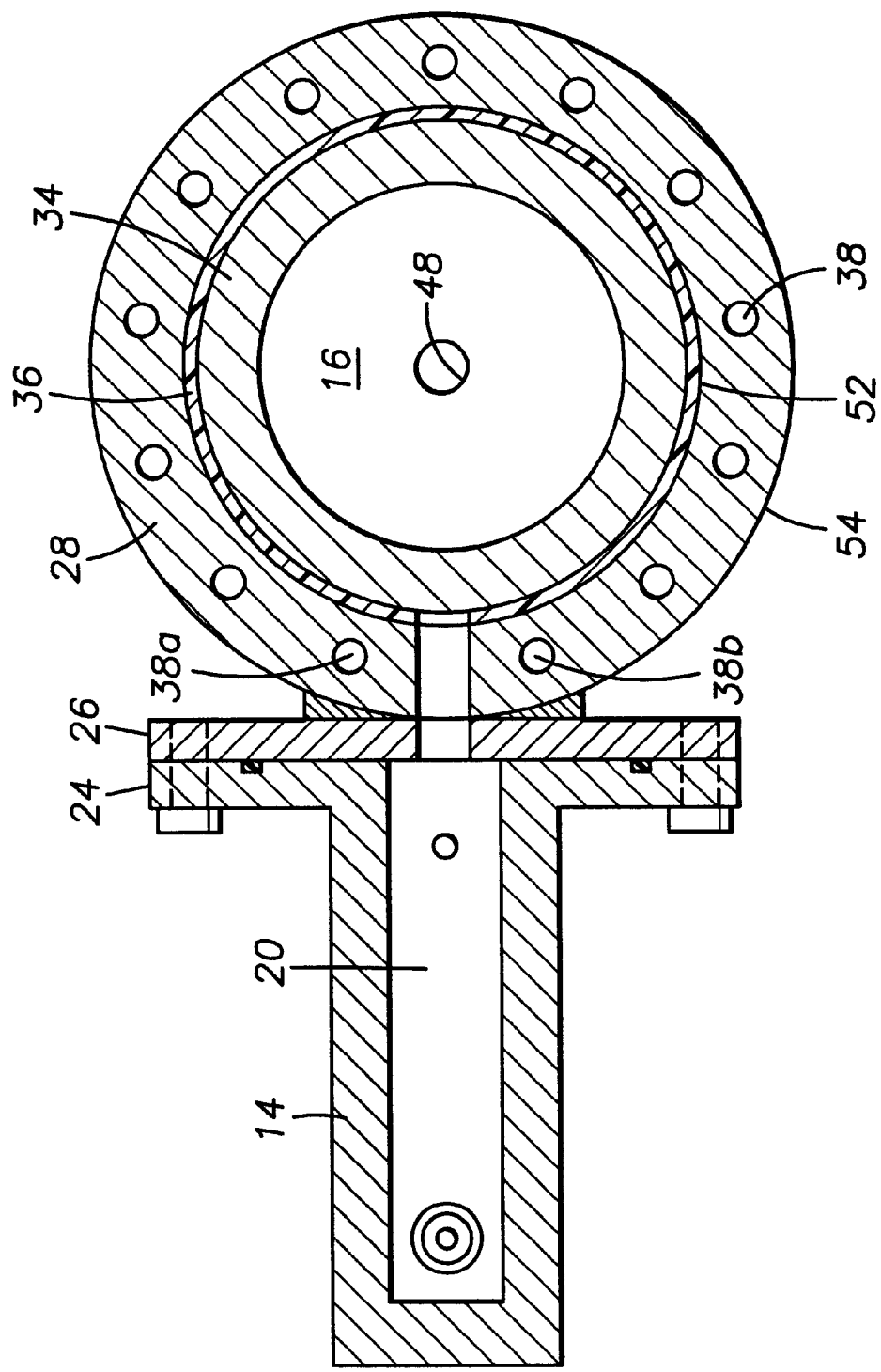
FIG. 2 is a cross-sectional view of the remote plasma generator 10 taken along line 2—2 in FIG. 1.

FIG. 2 is a cross-sectional view of the remote plasma generator 10 taken along line 2—2 in FIG. 1. The cooling channels 38 may be arranged in any convenient or effective manner, but are preferably substantially evenly spaced about the perimeter of the cover 28. Depending upon the thickness of the cover 28, it may be possible to position the channels nearer the inner surface 52 of the cover 28 than the outer surface 54.

Figure 3:
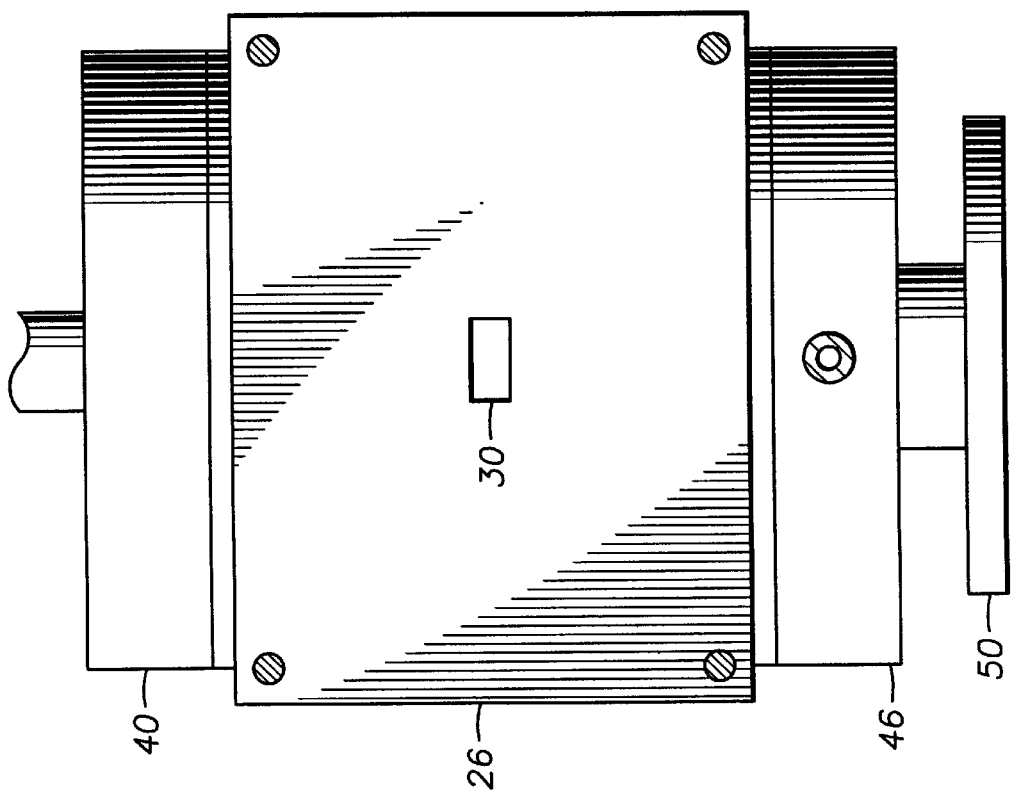
FIG. 3 is a face view of the flange 26 taken along line 3—3 in FIG. 1.

FIG. 3 a face view of the flange 26 taken along line 3—3 in FIG. 1. The slot 30 extends through the flange 26 and the metal cover 28 to allow the microwave energy to pass into the resonant cavity 16.

Figure 4:
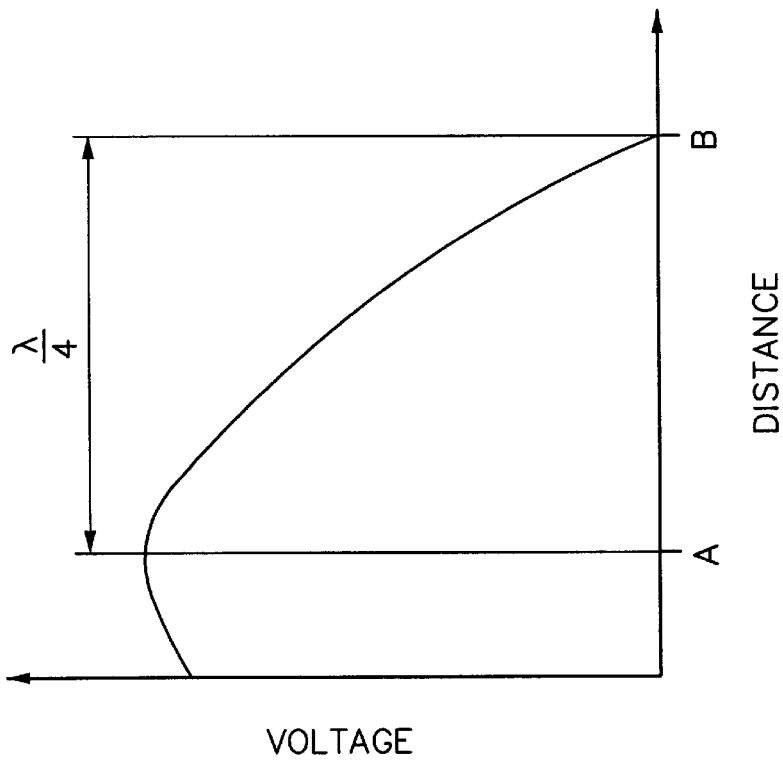
FIG. 4 is a graph of the voltage present in the resonant cavity as a function of the distance between the points A and B shown in FIG. 1.

FIG. 4 is a graph of the voltage present in the resonant cavity 16 as a function of the distance between the points A and B shown in FIG. 1. The graph indicates that in a one-quarter wavelength resonant chamber, the voltage is highest near the slot and drops at a slightly faster rate as the distance from the slot 30 increases.

More generally, the present invention provides a remote plasma source which can be used as a stand alone plasma source for cleaning, etching or depositing materials in a processing chamber or in conjunction with other plasma sources inside or outside a processing chamber. The remote plasma source generally comprises a microwave generator in communication with a microwave resonant cavity or chamber. The microwave resonant chamber, generally defined by a microwave reflective shell such as a metal cover, includes a microwave transparent tube that extends therethrough for the passage of gases to be activated or excited and delivered to the processing chamber.

One aspect of the invention provides a generally cylindrical shaped quarter wave resonant cavity or chamber formed from a conductive, metallic material. Cooling passages are disposed in the walls of the cavity so that a cooling fluid may be constantly passed therethrough to dissipate heat generated in the plasma cavity.

Another aspect of the invention provides a resonant cavity having a first lid with a gas inlet port and a second lid with a gas outlet port. The gas inlet in the first lid supplies low pressure precursor gases into a microwave transparent lining in the resonant cavity where the gases can be ionized. The gas outlet in the second lid is generally opposed to the gas inlet and allows the excited gases to flow from the resonant cavity into a processing chamber. The first and second lids preferably include a metal shell and an insulative material for contacting the microwave transparent lining and forming a continuous gas barrier therewith. Preferably, the lids also include cooling fluid ports and distribution channels that communicate with the cooling fluid passages in the walls of the resonant cavity.

Yet another aspect of the invention provides a slot disposed through the metallic exterior wall of the cavity to inject energy, preferably microwave energy, from a remote power source through an internal dielectric wall interior to the cavity. The slot and a variable capacitance device form a matching network for coupling the energy into the cavity to excite a gas provided therein into a plasma state.

While the foregoing is directed to the preferred embodiment of the present invention, other and further embodiments of the invention may be devised without departing from the basic scope thereof, and the scope thereof is determined by the claims which follow.

What is claimed is:

1. A remote plasma source, comprising:
   (a) a chamber having a microwave reflective wall, a gas inlet, a gas outlet, and a tube disposed within the chamber in fluid communication between the gas inlet and the gas outlet, wherein the tube is substantially transparent to microwave energy;
   (b) a source of microwave energy disposed to communicate microwave energy into a gas inside the tube through a window in the wall; and
   (c) a cooling jacket disposed in thermal communication with the microwave reflective wall.

2. The remote plasma source of claim 1, wherein the chamber is generally cylindrical.

3. The remote plasma source of claim 2, wherein the chamber has an inner diameter of about one quarter wavelength at the operating microwave frequency.

4. The remote plasma source of claim 1, wherein the source of microwave energy is operable at a frequency of 2.45 GHz.

5. The remote plasma source or claim 1, wherein the microwave reflective wall comprises a conductive metallic shell.

6. The remote plasma source of claim 5, wherein the conductive metallic shell is grounded.

7. The remote plasma source of claim 1, wherein the source of microwave energy communicates with the window through a waveguide.

8. The remote plasma source of claim 7, further comprising means for matching the impedance of the waveguide to the impedance of the chamber.

9. The remote plasma source of claim 1, wherein the tube forms a gas containing member.

10. The remote plasma source of claim 9, wherein the gas containing member is comprised of an insulative material.

11. The remote plasma source of claim 10, wherein the insulative material is selected from the group consisting of sapphire, quartz, aluminum oxides, or polytetrafluoroethylene.

12. The remote plasma source of claim 9, further comprising a compressible and microwave transparent material disposed between the gas containing member and the microwave reflective wall.

13. The remote plasma source of claim 1, wherein the microwave reflective wall comprises a metal.

14. The remote plasma source of claim 13, wherein the cooling jacket is integrally formed within the microwave reflective wall.

15. The remote plasma source of claim 14, wherein the cooling jacket comprises a channel for flowing a heat transfer fluid.

16. A remote plasma source, comprising:
(a) a chamber having a metal wall, cooling channels formed within the metal wall, a window extending through the wall, a gas inlet and a gas outlet;
(b) a microwave transparent gas tube disposed within the chamber in fluid communication with the gas inlet and gas outlet; and
(c) a source of microwave energy communicating microwave energy through the window into the chamber.

17. The remote plasma source of claim 16, further comprising a compressible and substantially microwave transparent material disposed between the gas tube and the metal wall.

* * * * *

UNITED STATES PATENT AND TRADEMARK OFFICE
CERTIFICATE OF CORRECTION

PATENT NO. : 5,902,404
DATED : May 11, 1999
INVENTOR(S) : Fong, et. al.

It is certified that error appears in the above-indentified patent and that said Letters Patent is hereby corrected as shown below:

In column 1, line 18, please replace "hi" with --In--.

Signed and Sealed this

Sixteenth Day of November, 1999

Attest:

Q. TODD DICKINSON

*Attesting Officer*    *Acting Commissioner of Patents and Trademarks*